United States Patent [19]

Yamamoto et al.

[11] Patent Number: 5,179,185

[45] Date of Patent: Jan. 12, 1993

[54] HIGH PURITY HYDROXY-TERMINATED PHENYL LADDER POLYSILOXANE AND METHOD FOR PRODUCING THE SAME

[75] Inventors: Shigeyuki Yamamoto; Hiroshi Adachi, both of Amagasaki, Japan

[73] Assignee: Mitsubishi Denki Kabushiki Kaisha, Tokyo, Japan

[21] Appl. No.: 625,990

[22] Filed: Nov. 29, 1990

[30] Foreign Application Priority Data

Jan. 10, 1990 [JP] Japan ............... 2-2868

[51] Int. Cl.$^5$ ............................. C08G 77/02
[52] U.S. Cl. ........................... 528/32; 528/43
[58] Field of Search ....................... 528/32, 43

[56] References Cited

U.S. PATENT DOCUMENTS 5,081,202  1/1992  Adachi et al. ............... 528/43

FOREIGN PATENT DOCUMENTS 0076656  4/1983  European Pat. Off. .
56-125855  10/1981  Japan .
57-18729  1/1982  Japan .

OTHER PUBLICATIONS

Chemical Abstracts, vol. 84 No. 4, Jan. 26, 1976 Columbus, Ohio, abstract No. 17970Y, Andrianov, et al. Poly(vinylphenylsilsequioxane) p. 19, column R.

Patent abstracts of Japan vol. 13 No. 302 (C-616)(3650) Jul. 12, 1989; High Purity Phenylsilicone Ladder Polymer and Production and Thereof; JP 1-092,224, Apr. 11, 1989.

Polymer Preprinte, Japan, vol. 30, No. 1, p. 212, 1981, A Hirao, et al., "Synthesis of Soluble Polysilsesquioxanes Having Functional Groups".

Journal of Japan Chemical Society, 1974, (1), pp. 108–111.

Primary Examiner—Melvyn I. Marquis
Attorney, Agent, or Firm—Oblon, Spivak, McClelland, Maier & Neustadt

[57] ABSTRACT

High purity hydroxy-terminated phenyl and alkenyl substituted ladder polysiloxane, which contains therein 1 ppm or below of each of sodium, potassium, iron, copper, lead and chloride, and 1 ppb or below of each of uranium and thorium, and is represented by the following general formula (I):

$$\text{HO} \begin{bmatrix} (R_1)_m \\ | \\ \text{Si}-\text{O} \\ | \\ \text{O} \\ | \\ \text{Si}-\text{O} \\ | \\ (R_2)_l \end{bmatrix}_n \begin{matrix} \text{H} \\ \\ \\ \text{H} \end{matrix} \quad (I)$$

where: $R_1$ is phenyl and $R_2$ is an alkenyl group; n is an integer of from 7 to 1600; m and l are natural numbers satisfying relationships of $2n = m + l$ and $l/m + l \geq 0.02$.

The high purity hydroxy-terminated ladder polysiloxane contains photosensitive groups in its side chain and is useful as a protective film and as an interlayer insulating film in the production of semiconductor elements.

8 Claims, No Drawings

HIGH PURITY HYDROXY-TERMINATED PHENYL LADDER POLYSILOXANE AND METHOD FOR PRODUCING THE SAME

This invention relates to a photo-curable hydroxy-terminated phenyl ladder polysiloxane having a photosensitive group in its side chain and which can be suitably used as a protective film and an interlayer insulating film in the production of semiconductor elements, etc., a method for producing a high purity hydroxy-terminated phenyl ladder siloxane prepolymer, and a method for producing high purity hydroxy-terminated phenyl ladder polysiloxane.

There have so far been proposed various methods for producing photosensitive hydroxy-terminated phenyl ladder polysiloxane for use as a protective film, an interlayer insulating film, etc. for electronic parts or semiconductor elements (vide: "Polymer Preprint, Japan", Vol. 30, No. 1, p212 (1981) and "Journal of Japan Chemical Society", 1974, (1), pp108–111).

These methods are to hydrolyze organo-chlorosilane, and then the hydrolyzed product is condensed at a high concentration in the presence of alkali and at a high temperature, or an aqueous solution of potassium silanolate is prepared from organo-chlorosilane, and then this aqueous solution is reacted with an acid anhydride.

These methods, however, have a disadvantage such that they tend to readily cause gellation during the synthesis. Or, even if polysiloxane having the ladder structure could be obtained by the above-described methods of production, the photosensitive hydroxy-terminated phenyl ladder polysiloxane as produced contains therein a large quantity of impurities and by-products. The reason for this is that the substance was produced under such conditions that the impurities and by-products are difficult to be removed, e.g., high polymerization is done at a high concentration of the hydrolyzed substance ("Polymer Preprint, Japan", Vol. 30, No. 1, p212 (1981), or a large amount of catalyst is used during the reaction ("Journal of Japan Chemical Society", 1974, (1), pp108–111), or others. The film formed with use of the photosensitive hydroxy-terminated phenyl ladder polymer produced by the above-mentioned methods is liable to bring about cracks, and the formation of the substance into the film was difficult due to the polymer having its number average molecular weight of a few tens of thousand.

The present invention has been made with a view to solving the above-described problems, and aims at producing hydroxy-terminated phenyl ladder polysiloxane for the semiconductor elements, which is capable of being polymerized to a high molecular weight, being formed into a film of a thickness adapted to the protective film and the interlayer insulating film of the semiconductor elements, being free from cracks in the cured film, and being excellent in its heat-resistance.

Another aspect of the present invention is to provide a method for producing a high purity hydroxy-terminated phenyl ladder siloxane prepolymer, which is free from residues of impurities and by-products, contains therein 1 ppm or below of each of sodium, potassium, iron, copper, lead and chlorine, and 1 ppb or below of each of uranium and thorium, and is represented by the following general formula (I):

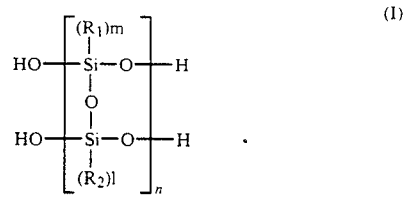

[where: $R_1$ is phenyl and $R_2$ is an alkenyl group; n is an integer of from 7 to 16; m and l are natural numbers satisfying relationships of $2n = m+l$ and $l/m+l \geq 0.02$].

Still another aspect of the present invention is to provide a method for producing a high purity hydroxy-terminated phenyl ladder polysiloxane, which is free from residues of impurities and by-products, contains therein 1 ppm or below of each of sodium, potassium, iron, copper, lead and chlorine, and 1 ppb or below of each of uranium and thorium, and is represented by the following general formula (I):

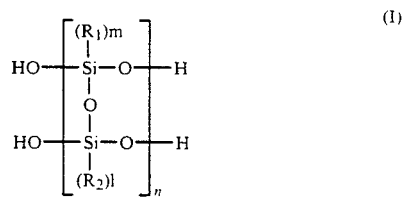

[where: $R_1$ is phenyl and $R_2$ is an alkenyl group; n is an integer of from 7 to 1600; m and l are respectively natural numbers satisfying relationships of $2n = m+l$ and $l/m+l \geq = 0.02$].

Hydroxy-terminated phenyl ladder polysiloxane for use in the production of semiconductor elements, according to the present invention, contains therein 1 ppm or below of each of sodium, potassium, iron, copper, lead and chlorine, and 1 ppb or below of each of uranium and thorium, and is represented by the following general formula (I):

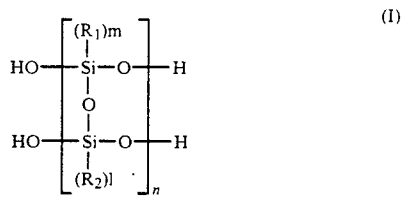

[where: $R_1$ is phenyl and $R_2$ is an alkenyl group; n is an integer of from 570 to 1600; m and l are respectively natural numbers satisfying relationships of $2n=m+l$ and $l/m+l \geq = 0.02$].

The method for producing a high purity hydroxy-terminated phenyl ladder siloxane prepolymer, according to the present invention, which contains therein 1 ppm or below of each of sodium, potassium, iron, copper, lead and chlorine, and 1 ppb or below of each of uranium and thorium, and is represented by the general formula (I) shown above (where: $R_1$ and $R_2$ are each alkenyl group or phenyl group; n is an integer of from 7 to 16; m and l are natural numbers satisfying relationships of $2n=m+l$ and $l/m+l \geq 0.02$) comprises steps of: dissolving into an organic solvent a mixture prepared by mixing 2 mol % or above of a compound to be represented by the following general formula (II) with phenyl trichlorosilane so as to be in a concentration of from 0.05 to 0.45 g/mol; then hydrolyzing the solution by adding 3 to 30 mol parts of super-demineralized water to 1 mol part in total of the above-mentioned phenyl trichlorosilane and a compound of the general formula (II); and thereafter rinsing the hydrolyzed product with super-demineralized water.

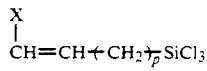 (II)

[where: X is one of hydrogen atom, methyl group, ethyl group and phenyl group; p is an integer of from 0 to 10]

Further, another method for producing a high purity hydroxy-terminated phenyl ladder polysiloxane, according to the present invention, which contains therein 1 ppm or below of each of sodium, potassium, iron, copper, lead and chlorine, and 1 ppb or below of each of uranium and thorium, and is represented by the general formula (I) shown in the foregoing (where: $R_1$ and $R_2$ are each alkenyl group or phenyl group; n is an integer of from 7 to 1600; m and l are natural numbers satisfying relationships of $2n=m+l$ and $l/m+1 \geq 0.02$) comprises steps of: dissolving into an organic solvent a mixture prepared by mixing 2 mol % or above of a compound to be represented by the general formula (II) shown above with phenyl trichlorosilane so as to be in a concentration of from 0.05 to 0.45 g/ml; then hydrolyzing the thus prepared solution by adding thereto, at a room temperature or below, 3 to 30 mol parts of super-demineralized water with respect to 1 mol part in total of the above-mentioned phenyl trichlorosilane and a compound represented by the general formula (II); thereafter rinsing the hydrolyzed product with super-demineralized water to obtain a polymer; adding a nucleophilic reagent to the layer of the above-mentioned organic solvent in a quantity to be in a range of from 0.005 to 0.5% by weight with respect to the above-mentioned prepolymer; then heating the batch to subject the hydrolyzed product to the dehydration-condensation reaction, thereby obtaining a high molecular weight substance; and finally refining this high molecular weight substance by the dissolving and reprecipitating method with its concentration in a good solvent ranging from 2 to 8% by weight.

The intended purpose of the present invention can be achieved by the above-mentioned substance and the method for producing the same.

The integer n in the above shown general formula (I) relating to hydroxy-terminated phenyl ladder polysiloxane for semiconductor according to the present invention is in a range of from 570 to 1600. When n is smaller than 570, the polymer obtained is inferior in its film-forming property required for the production of the semiconductor elements. On the contrary, when n is greater than 1600, its solubility becomes deteriorated.

Phenyl trichlorosilane and the compound represented by the general formula (II) to be used in the method for producing high purity hydroxy-terminated phenyl ladder siloxane prepolymer according to one object of the present invention, and the method for producing high purity hydroxy-terminated phenyl ladder polysiloxane according to another object of the present invention should preferably be those which were refined in advance by distilling them in the nitrogen gas current under a reduced pressure. Phenyl trichlorosilane and the compound represented by the general formula (II), as refined, should preferably be handled in such a manner that they may not be exposed to moisture-containing air, since these compounds are readily hydrolyzed with moisture in the air to be turned into silica, while generating hydrogen chloride.

The siloxane compound represented by the above-shown general formula (I) is one having 2 mol or more of the photosensitive group to be represented by the following general formula (III):

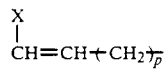 (III)

[where: X is hydrogen atom, methyl group, ethyl group or phenyl group, each being excellent in its photopolymerization, when hydroxy-terminated phenyl ladder polysiloxane to be produced is photo-sensitized; and p is an integer of from 0 to 10 in view of its heat-resistant property].

As the silane compound represented by the above-shown general formula (II), there may be exemplified vinyl trichlorosilane, allyl trichlorosilane, 2-phenyl vinyl trichlorosilane, 3-phenyl allyl trichlorosilane, and others, although the compound is not limited to these examples alone.

For dissolving, into the organic solvent, phenyl trichlorosilane and the compound represented by the general formula (II) to be used in the methods of the present invention, the mixing quantity of the compound represented by the general formula (II) with respect to phenyl trichlorosilane should be 2 mol % or above. Also, concentration of the mixture of phenyl trichlorosilane and the compound represented by the general formula (II) in the organic solvent is in a range of from 0.05 to 0.45 g/ml. When the concentration is below 0.05 g/ml, the rate of polymerization reaction is slow and the prepolymer to be obtained is of a low molecular weight with the consequence that the above-mentioned hydrolyzed organic solvent as rinsed becomes difficult to be separated into its organic layer and water layer, after termination of the reaction. On the contrary, if the concentration exceeds 0.45 g/ml, the rate of polymerization increases partially due to heat generated during the hydrolyzation not being dissipated effectively, so that the above-mentioned solution of organic solvent for hydrolysis tends to be gelled. As the above-mentioned organic solvent, there may be used non-aqueous type organic solvent capable of dissolving the hydrolyzed product. Examples of such organic solvents are: ketones such as methyl isobutyl ketone, methyl ethyl ketone, and so on; ethers such as diethylether, isopropylether, and so on; aromatic hydrocarbons such as xylene, toluene, benzene, and so on; and various others. Of these various organic solvents, those of "ELSS grade" (high purity chemicals for use in electronic industry) are preferred, and two or more kinds of these organic solvents should preferably be used in mixture.

In the methods of the present invention, super-demineralized water is added to the organic solvent solution, in which phenyl trichlorosilane and the compound represented by the general formula (II) have been dissolved into an organic solvent. This super-demineralized water should preferably be dripped, because of vigorous heat of hydrolyzation to be generated if and when the super-demineralized water is added in one time. Accordingly, at the time of dripping super-demineralized water, it is preferable to cool the organic solvent, while agitating the same. Here, the term "super-demineralized water" is meant by pure (demineralized) water having resistivity of 16 MΩ.cm or above, after removal of impurities to the maximum possible extent. In order that the hydrolysis of phenyl trichlorosilane and the compound of the general formula (II) may advance satisfactorily, the dripping quantity of the super-demineralized water should be in a range of from 3 to 30 mol parts with respect to 1 mol part in total of phenyl trichlorosilane and the compound of the general formula (II). When the dripping quantity of super-demineralized water is below 3 mol parts, there remain, in some occasion, unreacted phenyl trichlorosilane and compound of the general formula (II). On the contrary, when the dripping quantity exceeds 30 mol parts, there can be obtained no effect of its addition for the excessive quantity; far from this, the phase-separation between the organic solvent layer and the water layer becomes difficult. The addition of the super-demineralized water to the organic solvent solution is done at room temperature or below, or preferably at a temperature ranging from $-5°$ C. to 25° C. When the temperature is lower than $-5°$ C., the super-demineralized water as dripped tends to crystallize or the hydrolytic reaction is apt to slow down. On the contrary, when the temperature exceeds 25° C., the rate of reaction becomes accelerated, accompanied by vigorous heat generation, on account of which the resulting prepolymer would readily take an irregular molecular structure. After completion of dripping of the super demineralized water, agitation of the mixture liquid should preferably be continued for further two hours to complete the hydrolytic reaction. After termination of the reaction, the reaction liquid is separated into two phases of the organic solvent layer and the water layer. Of these separated layers, the water layer constituting the under layer is removed by means of a liquid-separating funnel, etc., and the organic solvent layer containing therein the prepolymer is recovered.

The organic solvent layer as recovered in the methods of the present invention is subsequently rinsed with super-demineralized water. There is no limitation to the method of rinsing, and various known methods may be arbitrarily adopted. Exemplifying one method, the organic solvent layer is mixed with the super-demineralized water in the same volume, and, after agitating or shaking the liquid mixture, the organic solvent layer is taken out. When this rinsing method is adopted, the above-mentioned rinsing operation should preferably be repeated for three or more times, whereby not only sodium ion and potassium ion, but also chlorine ion to be generated in a large quantity can be readily removed. The removal of these impurities is considered due to the resulted prepolymer having a ladder type structure, which makes it difficult to capture the impurities into its molecules.

By the way, the above-mentioned prepolymer has a small molecular weight, hence it cannot be recovered by the ordinary precipitation method using an appropriate solvent. It is therefore preferred to recover the prepolymer in the form of powder by first fractionating the solvent, and then drying the residue to solidify.

In the above-described manner, there can be recovered the high purity hydroxy-terminated phenyl ladder siloxane prepolymer according to preferred examples of the present invention, containing therein 1 ppm or below of each of sodium, potassium, iron, copper, lead and chlorine, and 1 ppb or below of each of uranium and thorium, and being represented by the following general formula (I), where n is an integer of 7 to 16. In this prepolymer, when n in the general formula (I) is smaller than 7, its recovery is difficult, and when n exceeds 16, polymerization into a high molecular weight substance becomes difficult.

In further aspect of the method according to the present invention, when recovering the organic solvent layer containing therein the above-mentioned prepolymer, or the prepolymer per se in the form of powder, there can be obtained high purity hydroxy-terminated phenyl ladder polysiloxane represented by the general formula (I), where n is an integer of 17 to 1,600, by the steps of: dissolving the prepolymer into an organic solvent; then transferring the organic solvent solution into, for example, a quartz glass flask equipped with an agitating rod made of fluorine-containing resin, a reflux condenser, and a Dean-Stark trap; subsequently adding a nucleophilic reagent into this flask; heating the liquid mixture to subject it to dehydration-condensation to obtain a high molecular weight substance; and refining the thus obtained high molecular weight product by the dissolving and reprecipitating method. The concentration of the prepolymer in the organic solvent should preferably be adjusted in an ordinary range of from 0.01 to 0.5 g/ml, or more preferably from 0.05 to 0.25 g/ml. As the above-mentioned organic solvent, there may be used a non-aqueous organic solvent which is capable of dissolving the above-mentioned prepolymer. Examples of such organic solvents are: ketones such as methyl isobutyl ketone, methyl ethyl ketone, and others; ethers such as diethyl ether, isopropyl ether, and others; aromatic hydrocarbons such as xylene, toluene, benzene, and so forth; and various others. Of these various organic solvents, those of "ELSS grade" (high purity chemicals for use in electronic industry) are preferred, and two or more kinds of these organic solvents should preferably be used in mixture. As the nucleophilic reagent, there may be exemplified hydroxides of K, Na, Cs, and so forth. Preferably, potassium hydroxide, sodium hydroxide, etc. of "ELSS grade" should be used. The quantity of the nucleophilic reagent should preferably be in a range of from 0.005 to 0.5% by weight with respect to the prepolymer. When the nucleophilic reagent is in a quantity below 0.005% by weight, the catalytic activity thereof becomes small with the consequent decrease in the rate of reaction of the prepolymer. On the contrary, when its quantity exceeds 0.5% by weight, dissociation of the siloxane bonding to occur in the presence of the nucleophilic reagent preferentially advances with the consequence that the prepolymer does not tend to become a high polymer, and, in addition, the nucleophilic reagent remains as the impurity. By the way, when obtaining high purity hydroxy-terminated phenyl ladder polysiloxane having a degree of polymerization of 350 or above, the quantity of the nucleophilic reagent should preferably be in a range of from 0.01 to 0.1% by weight.

Subsequently, the prepolymer is subjected, under reflux, to dehydration and condensation in the organic solvent phase, to which the above-mentioned nucleophilic reagent has been added. The refluxing time, in this case, should preferably be 0.5 hour or longer. When the refluxing time is shorter than 0.5 hour, there may occur, in some case, that the reaction does not proceed so much. In this way, there is obtained a high molecular weight substance represented by the above-mentioned general formula (I) having the degree of polymerization (n) of from 17 to 1600, i.e., hydroxy-terminated phenyl ladder polysiloxane. The degree of polymerization (n) of the polymer is adjusted by appropriate selection of the kinds of the solvent and the catalyst, their quantity of use, and the time for the condensation reaction. Incidentally, the resulted hydroxy-terminated phenyl ladder polysiloxane contains therein a trace amount of the nucleophilic reagent as the impurity, which can be refined by the dissolving and reprecipitating method.

The dissolving and reprecipitating method as employed in the methods according to the present invention is the refining method, by which a solution prepared by dissolving an impurity-containing solute into a rich solvent, is gradually dripped into a poor solvent to reprecipitate the impurity. As the above-mentioned rich solvent for the purpose of the present invention, there may be used ether type solvents. A typical example of this rich solvent is tetrahydrofuran. The rich solvent should preferably be distilled beforehand, and then passed through a filter having an aperture diameter of 0.5 μm. As the above-mentioned poor solvent, there may be used alcohol type solvents. A typical example of this poor solvent is methyl alcohol. The poor solvent to be used should desirably be of high purity of "ELSS grade". The above-mentioned rich solvent is added in such a manner that concentration in the reaction solution of the above-mentioned hydroxy-terminated phenyl ladder polysiloxane, as the high molecular weight substance obtained by adding the nucleophilic reagent to the prepolymer, may be in a range of from 2 to 8% by weight. When the concentration of such hydroxy-terminated phenyl ladder polysiloxane is below 2% by weight, the polysiloxane is difficult to reprecipitate, hence difficult to be refined. On the contrary, when it exceeds 8% by weight, the concentration of the polymer becomes excessively high and the nucleophilic reagent is easily captured into the molecules, on account of which the polymer tends to become difficult to be refined by reprecipitation. Subsequently, the reaction solution containing therein hydroxy-terminated phenyl ladder polysiloxane, to which the rich solvent has been added, is gradually dripped into the poor solvent. The poor solvent should preferably be added in such a manner that the volume of the poor solvent may be in a range of from 5 to 20 times as large as that of the above-mentioned reaction solution. When the volume of the poor solvent is below five times, impurity ions become difficult to remove. On the contrary, when it exceeds 20 times, the solvent is wasted. By the way, it is for the efficient removal of the impurity ions that the above-mentioned rich solvent is dripped gradually. Thus, hydroxy-terminated phenyl ladder polysiloxane which has been recovered by addition of the reaction solution to the poor solvent for reprecipitation is further dissolved into the rich solvent in the same manner as mentioned above, and then the solution is dripped into the poor solvent to recover the polymer as the precipitate. This refining operation is repeated for three to five times, whereupon the content of the nucleophilic reagent lowers to 1 ppm or below.

When the thus obtained hydroxy-terminated phenyl ladder polysiloxane was analyzed by the infrared spectroscopy, there were respectively observed: in the bands of 1595 cm$^{-1}$ and 1430 cm$^{-1}$, absorption peaks belonging to Si-C$_6$H$_6$; in the bands of 1135 cm$^{-1}$ and 1045 cm$^{-1}$, absorption peaks belonging to the asymmetrical stretching vibration of Si-0-Si which indicate that the polymer possesses the ladder type structure; in the band of 3400 cm$^{-1}$, an absorption peak belonging to Si-OH which contributes to tight adhesion of the polymer to the substrate; and, in the band of 1270 cm$^{-1}$, an absorption peak belonging to the vinyl group which indicates that the polymer is photosensitive. From the results of the analyses, it has been verified that the above-mentioned polymer is the hydroxy-terminated phenyl ladder polysiloxane having the photosensitive group in its side chain.

In this way, there can be obtained high purity hydroxy-terminated phenyl ladder polysiloxane according to the preferred examples of the present invention, which contains therein 1 ppm or below of each of sodium, potassium, iron, copper, lead and chlorine, and 1 ppb or below of each of uranium and thorium, and is represented by the above-shown general formula (I) having the degree of polymerization (n) of from 17 to 1600.

In the following, the present invention will be explained in specific details with reference to preferred examples. It should, however, be noted that the present invention is not limited to these examples alone.

EXAMPLES 1 to 6

Phenyl trichlorosilane as the starting material was distilled in a nitrogen gas current under a reduced pressure of 15 mmHg and at a temperature of from 81 to 82° C. In the same manner, vinyl trichlorosilane was distilled in a nitrogen gas current under a reduced pressure of 15 mmHg and at a temperature of from 50 to 51° C. Further, allyl trichlorosilane was distilled in a nitrogen gas current under a reduced pressure of 15 mmHg and at a temperature of from 55° to 56° C.

52.9 g (0.25 mol) of the thus distilled phenyl trichlorosilane and vinyl trichlorosilane in its quantity as shown in Table 1 below, or allyl trichlorosilane in its quantity as also shown in Table 1 below, were dissolved in a solvent of "ELSS grade", and the mixture solution was transferred into a four-necked flask of a 2-liter capacity, equipped with a dripping funnel, a thermometer, and an agitator, followed by cooling the same to a temperature shown in Table 1 below (hydrolyzing temperature). Subsequently, while cooling the solution to maintain it at such temperature, super-demineralized water in its quantity as shown in Table 1 below was gradually dripped in a time period of from one to three hours, under agitation. At this instant, hydrogen chloride was generated vigorously. After termination of the dripping, the agitation was further continued for two hours to thereby complete the hydrolyzing reaction. This prepolymer solution was moved into a liquid-separating funnel and left to stand; thereafter it was separated into two layers. Subsequently, the water layer constituting the under layer and containing therein a large amount of hydrogen chloride was removed, while the organic layer containing therein the prepolymer was recovered. This organic layer was then rinsed by adding super-demineralized water in the same volume as that of the organic layer, and shaking the mixture liquid.

After repetition of this rinsing operation for five times to obtain the prepolymer according to these examples of the present invention, the quantities of impurities contained in the prepolymer after its rinsing were analyzed by means of an ion-chromatographic device ("Model No. IC-500": a product of Yokogawa-Hokushin Electric Appliances K. K., Japan). It was found that the content of chlorine ion in this prepolymer was approximately 1,000 ppm after the first rinsing, and 1 ppm or below after the third rinsing. Also, concentration of the potassium ion decreased with increase in the number of times of rinsing, which indicated 1 ppm or below after the third rinsing.

In the next place, the weight average molecular weight of each prepolymer thus obtained by the rinsing was measured by the gel-permeation chromatography ("Model No. TRI-ROTAR-VI": a product of Nippon Spectroscope K. K.). The results of the measurement are shown in Table 1 below. The quantities of the impurities in the prepolymer after its rinsing for three times are as shown in Table 1, wherein the content of each of sodium, potassium, iron, copper, lead, and chlorine was 1 ppm or below, and the content of each of uranium and thorium was 1 ppb or below.

In the next place, when the structure of each prepolymer was examined by the infrared spectroscopic method ("Model FT/IR-111", a product of Nippon Spectroscope K. K., Japan), it was verified that, due to the fact that the double peak of the siloxane bonding was observed in the vicinity of the band of 1110 cm$^{-1}$ (vide: "Journal of Polymer Science", 1963, Vol. C-1, page 83), each of these prepolymers had a structure as represented by the following general formula (I):

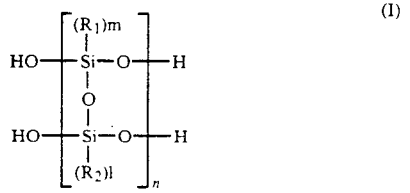

[where: $R_1$ is phenyl and $R_2$ is an alkenyl group; n is an integer of from 570 to 1600; m and l are natural numbers satisfying relationships of $2n = m + l$ and $l/m + l \geqq = 0.02$].

COMPARATIVE EXAMPLES 1 to 4

With the exception that the mixing ratio and the temperature for the hydrolysis were made as shown in Table 1 below, hydrolysis of the mixture of phenyl trichlorosilane and the compound of the above-mentioned general formula (II) was carried out, in the same manner as in Examples 1 to 6 above.

In the Comparative Examples 1 and 2, concentration of the above-mentioned mixture in the organic solvent was so low that the rate of reaction was very slow and the resulting product was of a low molecular weight with the consequence that, after stoppage of the reaction, the solution was not phase-separated and the reaction product could not be refined by rinsing.

In the Comparative Examples 3 and 4, concentration of the above-mentioned mixture in the organic solvent was so high that the rate of reaction was fast and the reaction product was readily gelled.

COMPARATIVE EXAMPLE 5

A solution prepared by dissolving 52.9 g of refined phenyl trichlorosilane and 43.9 g of refined allyl trichlorosilane into 347.4 ml of toluene was transferred into a four-necked flask of a 2-liter capacity, and cooled to a temperature of 10° C. Then, while cooling the solution to maintain it at such temperature, 540.5 ml of super-demineralized water was dripped under agitation, thereby carrying out the hydrolysis. It required three hours until completion of the dripping of super-demineralized water. Subsequently, the reaction solution was transferred to a liquid-separating funnel to extract the organic layer, and then it was rinsed for three times with super-demineralized water until it became neutral. Thereafter, toluene was fractionated and the residual substance was desiccated under a reduced pressure.

In the next place, concentration of the impurities contained in the thus obtained powder was examined by the atomic absorption photometry, the results of which are shown in Table 1 below. From Table 1, it will be seen that the super-demineralized water was in such a large quantity that the impurities could not be removed to a satisfactory extent.

COMPARATIVE EXAMPLE 6

A solution prepared by dissolving 52.9 g of refined phenyl trichlorosilane and 40.4 g of refined vinyl trichlorosilane into 168.0 ml of diethyl ether was transferred into a four-necked flask of a 2-liter capacity, and cooled to a temperature of −5° C. Then, while cooling the solution to maintain it at such temperature, 810.7 ml of super-demineralized water was dripped under agitation, thereby carrying out the hydrolysis. It required 2.5 hours until completion of the dripping of super-demineralized water. Subsequently, the reaction solution was transferred to a liquid-separating funnel to extract the organic layer, and then it was rinsed for three times with super-demineralized water until it became neutral. Thereafter, diethyl ether was fractionated and the residual substance was desiccated under a reduced pressure.

In the next place, concentration of the impurities contained in the thus obtained powder was examined by the atomic absorption photometry, the results of which are shown in Table 1 below. From Table 1, it will be seen that the super-demineralized water was in such a large quantity that the impurities could not be removed to a satisfactory extent.

TABLE 1a

| | | Mixing quantity | | | Super-demineralized water (ml) | Super-demineralized water A + B/(B)' (molar ratio) | Hydrolyzing temp. (°C.) | Concentration of reaction solution (g/ml)*1 |
|---|---|---|---|---|---|---|---|---|
| | Solvent (ml) | Phenyl trichloro-silane (A) | Vinyl trichloro-silane (B) | Allyl trichloro-silane (B)' | | | | |
| Example No. | | | | | | | | |
| 1 | Methyl isobutyl ketone (520.8) | 52.9 g (0.25 mol) | 40.0 g (0.25 mol) | — | 181.1 | 20.1 | 20 | 0.18 |
| 2 | Diethyl ether (325.5) | 52.9 g (0.25 mol) | 24.2 g (0.15 mol) | — | 93.7 | 13.0 | −5 | 0.24 |
| 3 | Xylene (1111.7) | 52.9 g (0.25 mol) | — | 43.9 g (0.25 mol) | 82.9 | 9.2 | 10 | 0.09 |

TABLE 1a-continued

|   | Solvent (ml) | Mixing quantity | | | Super-demineralized water (ml) | Super-demineralized water A + B/(B)' (molar ratio) | Hydrolyzing temp. (°C.) | Concentration of reaction solution (g/ml)*[1] |
|---|---|---|---|---|---|---|---|---|
|   |   | Phenyl trichloro-silane (A) | Vinyl trichloro-silane (B) | Allyl trichloro-silane (B)' |   |   |   |   |
| 4 | Benzene (347.4) | 52.9 g (0.25 mol) | — | 17.6 g (0.10 mol) | 96.5 | 15.3 | 5 | 0.20 |
| 5 | Toluene (500.5) | 52.9 g (0.25 mol) | 80.7 g (0.50 mol) | — | 405.3 | 30.0 | 0 | 0.27 |
| 6 | Toluene (471.7) | 52.9 g (0.25 mol) | — | 70.2 g (0.40 mol) | 286.9 | 24.5 | 0 | 0.26 |
| Comparative Example No. | | | | | | | | |
| 1 | Xylene (2604.0) | 52.9 g (0.25 mol) | 48.4 g (0.30 mol) | — | 151.6 | 15.3 | −15 | 0.04 |
| 2 | Xylene (2779.3) | 52.9 g (0.25 mol) | — | 26.3 g (0.15 mol) | 110.3 | 15.3 | 35 | 0.03 |
| 3 | Xylene (148.8) | 52.9 g (0.25 mol) | 32.3 g (0.20 mol) | — | 124.0 | 15.3 | −15 | 0.57 |
| 4 | Xylene (158.8) | 52.9 g (0.25 mol) | — | 61.4 g (0.35 mol) | 165.4 | 15.3 | 35 | 0.72 |
| 5 | Toluene (347.4) | 52.9 g (0.25 mol) | — | 43.9 g (0.25 mol) | 540.5 | 60.0 | 10 | 0.28 |
| 6 | diethyl ether (168.0) | 52.9 g (0.25 mol) | 40.4 g (0.25 mol) | — | 810.7 | 90.0 | −5 | 0.56 |

*[1]"Concentration of reaction solution" indicates concentration of phenyl trichlorosilane and the compound represented by the general formula (II) together in an organic solvent.

TABLE 1b

|   | Weight average molecular weight of prepolymer | Impurity contents in prepolymer | | | | | | | |
|---|---|---|---|---|---|---|---|---|---|
|   |   | Sodium (ppm) | Potassium (ppm) | Chlorine (ppm) | Iron (ppm) | Copper (ppm) | Lead (ppm) | Uranium (ppb) | Thorium (ppb) |
| Example No. | | | | | | | | | |
| 1 | 3200 | 0.81 | 0.90 | 0.89 | 0.85 or below | 0.85 or below | 0.85 or below | 1.0 or below | 1.0 or below |
| 2 | 2600 | 0.87 | 0.93 | 0.88 | 0.85 or below | 0.85 or below | 0.85 or below | 1.0 or below | 1.0 or below |
| 3 | 1900 | 0.75 | 0.89 | 0.82 | 0.85 or below | 0.85 or below | 0.85 or below | 1.0 or below | 1.0 or below |
| 4 | 2400 | 0.89 | 0.96 | 0.90 | 0.85 or below | 0.85 or below | 0.85 or below | 1.0 or below | 1.0 or below |
| 5 | 2800 | 0.83 | 0.91 | 0.87 | 0.85 or below | 0.85 or below | 0.85 or below | 1.0 or below | 1.0 or below |
| 6 | 3500 | 0.90 | 0.98 | 0.93 | 0.85 or below | 0.85 or below | 0.85 or below | 1.0 or below | 1.0 or below |
| Comparative Example No. | | | | | | | | | |
| 1 | 350 | — | — | — | — | — | — | — | — |
| 2 | 430 | — | — | — | — | — | — | — | — |
| 3 | Gelled | — | — | — | — | — | — | — | — |
| 4 | Gelled | — | — | — | — | — | — | — | — |
| 5 | 1700 | 1.7 | 2.0 | 1.8 | 1.1 | 1.3 | 1.2 | 10 or below | 10 or below |
| 6 | 2200 | 2.7 | 2.6 | 3.7 | 1.3 | 1.6 | 1.3 | 10 or below | 10 or below |

EXAMPLES 7 to 11

Solutions, each containing therein the prepolymer according to one method of the present invention, were prepared in the same manner as in Examples 1 to 6 above, with the exception that the kinds of the solvent, the quantity of their use, the quantity of use of super-demineralized water, the molar ratio of phenyl trichlorosilane and the compound represented by the above general formula (II), the molar ratio of super-demineralized water, phenyl trichlorosilane, and the compound represented by the above general formula (II), the hydrolyzing temperature, and the concentration of the produced prepolymer in the solution were respectively set in the values as shown in Table 2 below.

Subsequently, the solution containing therein the thus obtained prepolymer was transferred to a four-necked quartz flask of 2-liter capacity equipped with a stirring rod made of fluorine-containing resin, a Dean-Stark trap, and a thermometer. Then, potassium hydroxide solution, prepared by dissolving potassium hydroxide into methanol (ELSS grade) in a concentration of 0.1 g/ml was added, as the nucleophilic reagent, to the solution put in the four-necked flask in a quantity as shown in Table 2 below, and the batch was subjected to reaction under reflux and heat for a time period as indicated in Table 2 below. The quantity of dehydration during this reaction period was about 20 ml, and the reaction solution was fractionated in approximately one hour.

After the reaction solution was left to cool, refined tetrahydrofuran was added in such a quantity that the content of the high molecular weight substance might be at a concentration as shown in Table 2 below, and the mixture was sufficiently agitated to disperse, followed by dripping methyl alcohol (ELSS grade) in a quantity ten times as large as this solution, to thereby recover the precipitated product of hydroxy-terminated phenyl ladder polysiloxane having high molecular weight. After drying this precipitated product, tetrahydrofuran same as that mentioned above was added to this dried product to make it tetrahydrofuran solution of the same concentration as mentioned above, into which methyl alcohol was again dripped to obtain the precipitate of hydroxy-terminated phenyl ladder polysiloxane. This operation was repeated for four times to obtain high purity hydroxy-terminated phenyl ladder polysiloxane according to another method of the present invention.

The thus synthesized hydroxy-terminated phenyl ladder polysiloxane of high molecular weight was analyzed by gel-permeation chromatography (Model: "TRI-ROTAR-VI" manufactured by Nippon Spectroscope K. K., Japan) for its molecular weight; by atomic absorption photometer (Model: SAS-760, manufactured by Seiko Electronics Industry K. K., Japan) for the concentrations of sodium ion, potassium ion, iron ion, copper ion, and lead ion; by ion chromatography (Model: IC-500, manufactured by Yokogawa-Hokushin Electric Appliances K. K., Japan) for the concentration of chlorine ion; and by fluorescent spectrophometer (Model: MPF-4, manufactured by K. K. Hitachi Seisakusho, Japan) for the contents of radioactive uranium and thorium. The results are shown in Table 2 below.

In the next place, when the structure of the polymer obtained from each of the Examples 7 to 11 was examined by the infrared analysis, there were observed the absorption peaks belonging to Si-C$_6$H$_5$, in the bands of 1595 cm$^{-1}$ and 1430 cm$^{-1}$; the absorption peaks belonging to asymmetrical stretching vibration of Si-O-Si indicating that the polymer possesses the ladder structure, in the bands of 1135 cm$^{-1}$ and 1045 cm$^{-1}$; the absorption peak belonging to Si-OH which contributes to its tight adhesive property with the substrate, in the band of 3400 cm$^{-1}$; and the absorption peak belonging to the alkenyl group which indicates that the polymer is photosensitive, in the band of approximately 1270 cm$^{-1}$.

On the basis of the results of these analyses, each of the above-mentioned polymers of Examples 7 to 11 were verified to have the structure represented by the following general formula (I):

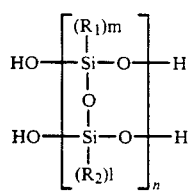

[where: R$_1$ is phenyl and R$_2$ is an alkenyl group; n is an integer of from 7 to 1600; m and l are natural numbers satisfying relationships of 2n=m+l and l/m+l≧=0.02].

As will be seen from Table 2 below, according to these Examples 7 to 11, there were obtained high purity hydroxy-terminated phenyl ladder polysiloxanes, which meet the intended purpose of the present invention. Further, the concentration of the impurity ions decreased with increase in the number of times of the reprecipitation.

EXAMPLES 12 to 16

In the same manner as in each of Examples 7 to 11 above, solution containing therein the high purity prepolymer was prepared and then the organic solvent was fractionated from the solution, thereby recovering the prepolymer according to the "one method" of the present invention.

Subsequently, at various mixing ratios as shown in Table 2 below, high purity hydroxy-terminated phenyl ladder polysiloxane was produced in accordance with the "another method" of the present invention, which was then analyzed in the same manner as in Examples 7 to 11 above. As the result, it was verified that the polymer had the structure as represented by the following general formula (I):

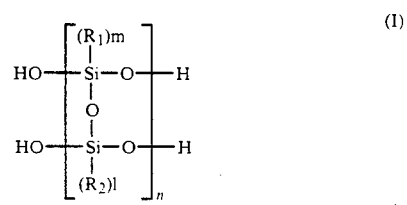

[where: R$_1$ is phenyl and R$_2$ is alkenyl group; n is an integer of from 7 to 1600; m and l are natural numbers satisfying relationships of 2n=m+l and l/m+l≧=0.02].

As will be seen from Table 2 below, according to Examples 12 to 16, there were obtained high purity hydroxy-terminated phenyl ladder polysiloxanes, which meet the intended purpose of the present invention.

COMPARATIVE EXAMPLES 7 to 9

Hydroxy-terminated phenyl ladder polysiloxane was obtained in the same manner as in Examples 7 to 11 above, with the exception that the kinds of the solvents, the quantity of their use, the quantity of super-demineralized water used, the molar ratio of phenyl trichlorosilane and the compound represented by the above general formula (II), the molar ratio of super-demineralized water, phenyl trichlorosilane, and the compound represented by the above general formula (II), the hydrolytic temperature, the quantity of the nucleophilic reagent, heating time, and the content of the polymer in the rich solvent were adjusted to those values shown in Table 2 below.

In Comparative Example 7, the quantity of the nucleophilic reagent was so excessive that decomposition of the principal chain advanced remarkably with the consequence that the polymer was of a small molecular weight, and the nucleophilic reagent added could not be removed sufficiently. In Comparative Example 8, the concentration of the solution in the rich solvent was so thin at the time of reprecipitation of the solution that the precipitated liquid became only turbid, and the polymer could not be recovered. In Comparative Example 9, concentration of the solution in the rich solvent was so high at the time of the reprecipitation of solution that no sufficient effect of refining could be attained, and the nucleophilic reagent added could not removed sufficiently as shown in Table 2 below.

From the results as shown in Tables 1 and 2, it will be seen that, in accordance with examples of the present invention, there can be obtained high purity and high molecular weight hydroxy-terminated phenyl ladder siloxane prepolymer and hydroxy-terminated phenyl ladder polysiloxane as well, with the least content of impurities such as sodium, potassium, chlorine, iron, copper, uranium, and thorium.

TABLE 2a

| Example No. | Solvent (ml) | Mixing quantity Phenyl trichloro-silane (A) | Vinyl trichloro-silane (B) | Allyl trichloro-silane (B)' | Super-demineralized water (ml) | Super-demineralized water A + B/(B)' (molar ratio) | Hydrolyzing temp. (°C.) | Concentration of reaction solution (g/ml) |
|---|---|---|---|---|---|---|---|---|
| 7 | Benzene (325.5) | 52.9 g (0.25 mol) | 40.4 g (0.25 mol) | — | 107.2 | 11.9 | 15 | 0.29 |
| 8 | Methyl isobutyl ketone (325.5) | 52.9 g (0.25 mol) | 40.4 g (0.25 mol) | — | 137.8 | 15.3 | 0 | 0.29 |
| 9 | Methyl isobutyl ketone (347.4) | 52.9 g (0.25 mol) | — | 35.1 g (0.20 mol) | 243.2 | 30.0 | 5 | 0.25 |
| 10 | Toluene (1111.7) | 52.9 g (0.25 mol) | — | 43.9 g (0.25 mol) | 137.8 | 15.3 | 0 | 0.09 |
| 11 | Xylene (555.9) | 52.9 g (0.25 mol) | — | 70.2 g (0.40 mol) | 179.2 | 15.3 | 5 | 0.22 |
| 12 | Benzene (520.8) | 52.9 g (0.25 mol) | 32.3 g (0.20 mol) | — | 162.9 | 20.1 | 0 | 0.16 |
| 13 | Methyl isobutyl ketone (347.4) | 52.9 g (0.25 mol) | 24.2 g (0.15 mol) | — | 21.6 | 3.0 | 0 | 0.22 |
| 14 | Methyl isobutyl ketone (347.4) | 52.9 g (0.25 mol) | — | 61.4 g (0.35 mol) | 165.4 | 15.3 | 15 | 0.33 |
| 15 | Toluene (555.9) | 52.9 g (0.25 mol) | — | 43.9 g (0.25 mol) | 133.3 | 14.8 | 10 | 0.17 |
| 16 | Xylene (347.4) | 52.9 g (0.25 mol) | — | 17.6 g (0.10 mol) | 93.3 | 14.8 | 0 | 0.20 |
| Comparative Example No. | | | | | | | | |
| 7 | Methyl isobutyl ketone (260.4) | 52.9 g (0.25 mol) | 40.4 g (0.25 mol) | — | 137.8 | 15.3 | 0 | 0.36 |
| 8 | Methyl isobutyl ketone (260.4) | 52.9 g (0.25 mol) | 16.1 g (0.10 mol) | — | 96.5 | 15.3 | 0 | 0.26 |
| 9 | Xylene (203.2) | 52.9 g (0.25 mol) | — | 52.7 g (0.30 mol) | 891.8 | 90.0 | −5 | 0.52 |

TABLE 2b

| | Weight average molecular weight of prepolymer | Recovered polymer (g) | Dehydration-condensation reaction under heat Solvent (ml) | Concentration of prepolymer in solution (g/cc) | Nucleo-philic reagent (wt %) | Heating time (h) | Concentration of high molecular weight substance in good solvent at the time of refining by dissolution and reprecipitation (wt %) | Weight average molecular weight of high purity hydroxy-terminated phenyl ladder polysiloxane |
|---|---|---|---|---|---|---|---|---|
| Example No. | | | | | | | | |
| 7 | 2600 | — | — | — | 0.005 | 2 | 8 | 52000 |
| 8 | 3400 | — | — | — | 0.40 | 2 | 8 | 88000 |
| 9 | 3300 | — | — | — | 0.60 | 25 | 5 | 182000 |
| 10 | 1700 | — | — | — | 0.40 | 25 | 5 | 175000 |
| 11 | 3800 | — | — | — | 0.10 | 25 | 5 | 217000 |
| 12 | 2100 | 43.7 | MIK* | 0.09 | 0.05 | 25 | 5 | 125000 |
| 13 | 2800 | 41.8 | MIK* | 0.13 | 0.5 | 30 | 5 | 149000 |
| 14 | 4300 | 47.1 | MIK* | 0.19 | 0.40 | 25 | 5 | 170000 |
| 15 | 2000 | 46.3 | Toluene | 0.10 | 0.40 | 25 | 5 | 189000 |
| 16 | 2500 | 49.9 | Xylene | 0.12 | 0.1 | 25 | 5 | 118000 |
| Comparative Example No. | | | | | | | | |
| 7 | 3500 | 44.3 | Xylene | 0.20 | 10 | 25 | 5 | 4000 |
| 8 | 2900 | 44.3 | Xylene | 0.15 | 0.40 | 25 | 1 | 179000 |

TABLE 2b-continued

| | Weight average molecular weight of prepolymer | Recovered polymer (g) | Dehydration-condensation reaction under heat | | | | Concentration of high molecular weight substance in good solvent at the time of refining by dissolution and reprecipitation (wt %) | Weight average molecular weight of high purity hydroxy-terminated phenyl ladder polysiloxane |
|---|---|---|---|---|---|---|---|---|
| | | | Solvent (ml) | Concentration of prepolymer in solution (g/cc) | Nucleophilic reagent (wt %) | Heating time (h) | | |
| 9 | 2300 | 43.6 | Xylene | 0.30 | 0.40 | 5 | 15 | 134000 |

*MIK: methyl isobutyl ketone

TABLE 2c

| | Impurity contents in high purity hydroxy-terminated phenyl ladder polysiloxane | | | | | | | |
|---|---|---|---|---|---|---|---|---|
| | Sodium (ppm) | Potassium (ppm) | Chlorine (ppm) | Iron (ppm) | Copper (ppm) | Lead (ppm) | Uranium (ppb) | Thorium (ppb) |
| Example No. | | | | | | | | |
| 7 | 0.63 | 0.83 | 0.59 | 0.85 or below | 0.85 or below | 0.85 or below | 1.0 or below | 1.0 or below |
| 8 | 0.59 | 0.80 | 0.58 | 0.85 or below | 0.85 or below | 0.85 or below | 1.0 or below | 1.0 or below |
| 9 | 0.69 | 0.87 | 0.68 | 0.85 or below | 0.85 or below | 0.85 or below | 1.0 or below | 1.0 or below |
| 10 | 0.67 | 0.90 | 0.70 | 0.85 or below | 0.85 or below | 0.85 or below | 1.0 or below | 1.0 or below |
| 11 | 0.68 | 0.89 | 0.72 | 0.85 or below | 0.85 or below | 0.85 or below | 1.0 or below | 1.0 or below |
| 12 | 0.63 | 0.92 | 0.65 | 0.85 or below | 0.85 or below | 0.85 or below | 1.0 or below | 1.0 or below |
| 13 | 0.60 | 0.88 | 0.58 | 0.85 or below | 0.85 or below | 0.85 or below | 1.0 or below | 1.0 or below |
| 14 | 0.56 | 0.83 | 0.59 | 0.85 or below | 0.85 or below | 0.85 or below | 1.0 or below | 1.0 or below |
| 15 | 0.70 | 0.95 | 0.73 | 0.85 or below | 0.85 or below | 0.85 or below | 1.0 or below | 1.0 or below |
| 16 | 0.67 | 0.87 | 0.65 | 0.85 or below | 0.85 or below | 0.85 or below | 1.0 or below | 1.0 or below |
| Comparative Example 7 | 1.0 | 1.5 | 1.6 | 0.9 or below | 0.9 or below | 0.9 or below | 1.0 or below | 1.0 or below |
| Comparative Example 8 | 1.1 | 1.7 | 1.8 | 0.9 or below | 0.9 or below | 0.9 or below | 1.0 or below | 1.0 or below |
| Comparative Example 9 | 1.7 | 2.8 | 1.9 | 1.5 | 1.7 | 1.5 | 10 or below | 10 or below |

As it is also possible to obtain high purity and high molecular weight hydroxy-terminated phenyl ladder polysiloxane having its weight average molecular weight of as large as 100,000 or more, the polymer can be suitably used for the surface protective film and the interlayer insulating film of semiconductor elements, hence it can contribute to improvement in operating reliability of the semiconductor elements.

As has been explained in the foregoing, the present invention makes it possible to provide hydroxy-terminated phenyl ladder polysiloxane which can be formed into the protective film, the interlayer insulating film, etc. for use in the production of semiconductor elements, and which prevents cracks from occurring in the cured film and is excellent in its heat-resistant property, which can be realized by by the use of a compound containing therein 1 ppm or below of each of sodium, potassium, iron, copper, lead and chlorine, and 1 ppb or below of each of uranium and thorium, and being represented by the following general formula (I):

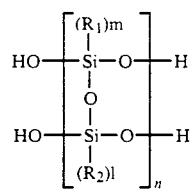
(I)

[where: $R_1$ is phenyl and $R_2$ is an alkenyl group; n is an integer of from 570 to 1600; m and l are respectively natural numbers satisfying relationships of $2n = m + l$ and $l/m + l \geq = 0.02$].

Further, the present invention is able to provide one method for producing high purity hydroxy-terminated phenyl ladder siloxane prepolymer which is free from residues of impurities and by-products, contains therein 1 ppm or below of each of sodium, potassium, iron, copper, lead and chlorine, and 1 ppb or below of each of uranium and thorium, and is represented by the general formula (I) shown above (where: $R_1$ and $R_2$ are each alkenyl group or phenyl group; n is an integer of from 7 to 16; m and l are natural numbers satisfying relationships of $2n = m + l$ and $l/m + l \geq = 0.02$), which method comprises steps of: dissolving into an organic solvent a mixture prepared by mixing 2 mol % or more of a compound to be represented by the following general formula (II) with phenyl trichlorosilane so as to be in concentration of from 0.05 to 0.45 g/ml; then hydrolyzing the solution by adding 3 to 30 mol parts of super-demineralized water at room temperature or below to 1 mol part in total of the above-mentioned phenyl trichlorosilane and the compound of the general formula (II); and thereafter rinsing the hydrolyzed product with super-demineralized water:

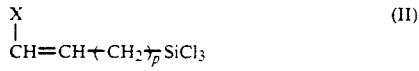  (II)

[where: X is one of hydrogen atom, methyl group, ethyl group and phenyl group; p is an integer of from 0 to 10].

Further, the present invention is able to provide another method for producing high purity hydroxy-terminated phenyl ladder polysiloxane which is free from residues of impurities and by-products, can be polymerized into a high molecular weight substance, can be formed into a thick film, prevents cracks from occurring in the cured film, contains therein 1 ppm or below of each of sodium, potassium, iron, copper, lead and chlorine, and 1 ppb or below of each of uranium and thorium, and is represented by the general formula (I) (where: $R_1$ and $R_2$ are each alkenyl group or phenyl group; n is an integer of from 7 to 1600; m and l are natural numbers satisfying relationships of $2n = m + l$ and $l/m + l \geq 0.02$), which method comprises steps of: dissolving into an organic solvent a mixture prepared by mixing 2 mol % or more of a compound to be represented by the general formula (II) with phenyl trichlorosilane so as to be in concentration of from 0.05 to 0.45 g/ml; then hydrolyzing the thus prepared solution by adding thereto, at room temperature or below, 3 to 30 mol parts of super-demineralized water with respect to 1 mol part in total of the above-mentioned phenyl trichlorosilane and compound represented by the general formula (II); thereafter rinsing the hydrolyzed product with super-demineralized water to obtain a prepolymer; adding a nucleophilic reagent to the above-mentioned organic solvent layer in a quantity to be in a range of from 0.005 to 0.5% by weight with respect to the above-mentioned prepolymer, then heating the batch to subject the hydrolyzed product to dehydration and condensation, thereby obtaining a high molecular weight substance; and finally refining this high molecular weight substance by the dissolving and reprecipitating method with its concentration in a good solvent ranging from 2 to 8% by weight.

We claim:

1. A high purity hydroxy-terminated phenyl and alkenyl substituted ladder polysiloxane, which contains therein 1 ppm or below of each of sodium, potassium, iron, copper, lead and chlorine, and 1 ppb or below of each of uranium and thorium, and is represented by the following formula:

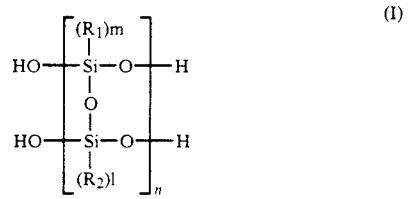  (I)

where $R_1$ is phenyl and $R_2$ is an alkenyl group; n is an integer of from 7 to 1600m and l are natural numbers satisfying relationships of $2n = m + l$ and $l/m + l \geq 0.02$.

2. A high purity hydroxy-terminated phenyl and alkenyl substituted ladder siloxane prepolymer which contains therein 1 ppm or below of each of sodium, potassium, iron, copper, lead and chlorine, and 1 ppb or below of each of uranium and thorium, and is represented by the following formula (I):

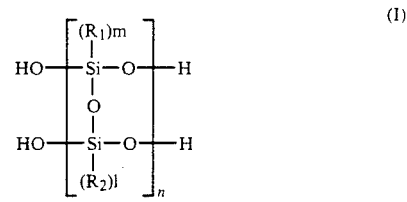  (I)

where: $R_1$ is phenyl and $R_2$ is an alkenyl group; n is an integer of from 7 to 16; m and l are natural numbers satisfying relationships of $2n = m + l$ and $l/m + l \geq 0.02$.

3. A high purity hydroxy-terminated ladder polysiloxane according to claim 1, where n is said formula (I) is an integer of from 17 to 1600.

4. A high purity hydroxy-terminated ladder polysiloxane according to claim 1, where n is said formula (I) is an integer of from 570 to 1600.

5. A method for producing a high purity hydroxy-terminated phenyl and alkenyl substituted ladder siloxane prepolymer which contains therein 1 ppm or below of each of sodium, potassium, iron, copper, lead and chlorine, and 1 ppb or below of each of uranium and thorium, and is represented by the formula (I)

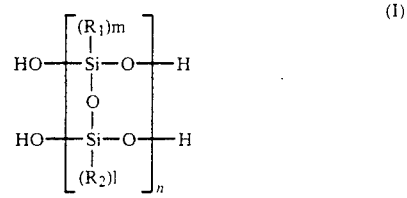  (I)

where $R_1$ is phenyl and $R_2$ is an alkenyl group; n is an integer of from 7 to 16; m and l are natural numbers satisfying relationships of $2n = m + l$ and $l/m + l \geq 0.02$, said method comprising the steps of:

preparing a solution by dissolving into an organic solvent a mixture prepared by mixing phenyl trichlorosilane with 2 mol % or above of a compound of the formula (II)

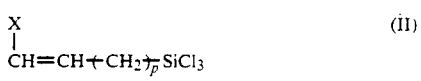  (II)

where X is a hydrogen atom, methyl group, ethyl group or phenyl group; p is an integer of from 0 to 10, the concentration of said mixture in said organic solvent being from 0.05 to 0.45 g/ml;

then hydrolyzing the solution by adding 3 to 30 mol parts of super-demineralized water to 1 mol par in total of said phenyl trichlorosilane and said compound of the formula (II), at room temperature or below;

and thereafter rinsing said hydrolyzed product with super-demineralized water.

6. A method for producing a high purity hydroxy-terminated phenyl ladder siloxane prepolymer according to claim 5, wherein said compound represented by the formula (II) is a silane compound selected from the group consisting of vinyl trichlorosilane allyl trichlorosilane, 2-phenyl vinyl trichlorosilane and 3-phenyl allyl trichlorosilane.

7. A method for producing a high purity hydroxy-terminated phenyl and alkenyl substituted ladder polysiloxane which contains therein 1 ppm or below of each of sodium, potassium, iron, copper, lead and chlorine, and 1 ppb or below of each of uranium and thorium, and is represented by the formula (I)

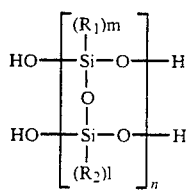

where $R_1$ is phenyl and $R_2$ is an alkenyl group; n is an integer of rom 7 to 1600; m and l are natural number satisfying relationships of $2n = m + l$ and $l/m + l \geqq 0.02$, said method comprising the steps of:

preparing a solution by dissolving into an organic solvent a mixture prepared by mixing phenyl trichlorosilane with 2 mol % or above of a compound of the formula (II)

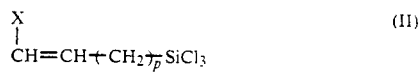

where: X in a hydrogen atom, methyl group, ethyl group or phenyl group; p is an integer of from 0 to 10, the concentration of said mixture in said organic solvent being from 0.05 to 0.45 g/ml;

then hydrolyzing the solution by adding 3 to 30 mol parts of super-demineralized water to 1 mol par in total of said phenyl trichlorosilane and said compound of the formula (II), at room temperature or below;

thereafter rinsing said hydrolyzed product with super-demineralized water;

adding nucleophilic reagent to the layer of said organic solvent in a quantity in the range of from 0.005 to 0.5% by weight with respect to said prepolymer;

then heating said mixture solution to subject said hydrolyzed product to dehydration and condensation, thereby obtaining a high molecular weight substance;

and refining said high molecular weight substance by dissolving it in a solvent at a concentration of from 2 to 8% by weight an reprecipitating it.

8. A method for producing a high purity hydroxy-terminated ladder polysiloxane according to claim 7, wherein said compound represented by the formula (II) is a silane compound selected from the group consisting of vinyl trichlorosilane, allyl trichlorosilane, 2-phenyl vinyl trichlorosilane and 3-phenyl allyl trichlorosilane.

* * * * *